United States Patent [19]

Jacco et al.

[11] Patent Number: 4,793,894

[45] Date of Patent: Dec. 27, 1988

[54] PROCESS FOR CRYSTAL GROWTH FROM SOLUTION

[75] Inventors: John C. Jacco, Woodstock, N.Y.; Gabriel M. Loiacono, Franklin Lakes, N.J.

[73] Assignee: North American Philips Corporation, New York, N.Y.

[21] Appl. No.: 110,298

[22] Filed: Oct. 19, 1987

Related U.S. Application Data

[63] Continuation-in-part of Ser. No. 24,239, May 10, 1987, Pat. No. 4,761,202, which is a continuation-in-part of Ser. No. 869,170, May 30, 1986, abandoned.

[51] Int. Cl.$^4$ .......................... C30B 7/08; C30B 7/10
[52] U.S. Cl. ............................ 156/623 R; 156/621; 156/622; 156/624; 156/DIG. 63; 156/DIG. 71; 156/DIG. 78; 156/DIG. 86; 156/DIG. 87; 156/DIG. 89
[58] Field of Search .................. 156/621, 622, 623 R, 156/624, DIG. 63, DIG. 71, DIG. 78, DIG. 86, DIG. 87, DIG. 89

[56] References Cited

U.S. PATENT DOCUMENTS

| | | |
|---|---|---|
| 4,000,247 | 12/1976 | Yamada et al. ..................... 423/306 |
| 4,082,601 | 4/1978 | Regreny et al. ............ 156/DIG. 71 |
| 4,500,397 | 2/1985 | Mori ................................. 204/180.9 |

FOREIGN PATENT DOCUMENTS 135159  4/1979  Fed. Rep. of Germany ...... 156/624

OTHER PUBLICATIONS

Nakano et al., Crystal Defects in Laser Material LiNdP$_4$O$_{12}$, Journal of Crystal Growth 53 (1981) pp. 375–381.

Jiang et al., Flux Growth of Large Single Crystals of Low Temperature Phase Barium Metaborate, Journal of Crystal Growth, 79 (1986) 963–969.

*Primary Examiner*—John Doll
*Assistant Examiner*—Robert M. Kunemund
*Attorney, Agent, or Firm*—Norman N. Spain

[57] ABSTRACT

A method of producing large flow-free single crystals of either LiNdP$_4$O$_{12}$ or XB$_2$O$_4$, where X is Ba, Sr or Ca, comprising the steps of, preparing a mixture of the final product and a flux of oxide of their precursors, melting the mixture, fluxing at a temperature substantially equal to the saturation value then suspending a seed in the melt, and cooling while maintaining essentially spatially isothermal conditions throughout said melt to crystallize single crystals on the seed.

9 Claims, No Drawings

PROCESS FOR CRYSTAL GROWTH FROM SOLUTION

RELATED APPLICATION

This application is a continuation-in-part of application, Ser. No. 24,239, filed May 10, 1987 now U.S. Pat. No. 4,761,202 which is a continuation-in-part of application, Ser. No. 869,170, filed May 30, 1986, now abandoned.

BACKGROUND OF THE INVENTION

This invention relates to a method for the production of large single crystals of $LiNdP_4O_{12}$ and $BaB_2O_4$.

In the related application, Ser. No. 24,239, one of us and another member of our research team described a new process to grow substantially flaw-free large single crystals of a class of compounds by use of flux growth techniques, provided that the growth is carried out under essentially spatially isothermal conditions. This class of compounds has the formula $MTiOXO_4$ where M is K, Tl, Rb or mixtures thereof, and X is P or As. Such crystals have various optical uses, as described in said application and the referenced publications. In the process described, the single crystals are grown from a melt produced by heating a mixture of $MTiOXO_4$ and a flux comprising the oxides of M and X (wherein M and X have their above-designated meanings) in the ratio by weight of M to X of from 3 to 1 to 1 to 1, the ratio by weight of $MTiOXO_4$ to flux at the highest heating temperature being substantially equal to the saturation value of the $MTiOXO_4$ in the flux, or of their precursors, by slowly cooling the melt while the melt is maintained under essentially spatially isothermal conditions to thereby cause the $MTiOXO_4$ to crystallize from the melt onto a seed crystal of $MTiOXO_4$ suspended in the melt. The melt is considered to be maintained under essentially spatially isothermal conditions when the maximum difference in temperatures between any two points in the melt is not greater than about 4° C., and preferably less than 2° C. In a preferred embodiment, the defined spatially isothermal conditions at high-temperature used during the growth process are achieved by surrounding the crucible containing the melt with an elongated heat pipe, preferably constructed of a double-walled Inconel tube filled with sodium.

We have now discovered that the same kind of process can be employed to grow single crystals of other optically useful materials, specifically, lithium neodymium tetraphosphate ($LiNdP_4O_{12}$) (also referred to as "LNP") and barium borate ($BaBO_2O_4$) (also referred to as "BBO"). In the process of this invention, we use exactly the same furnace with elongated heat pipe as described in said related application, whose contents are hereby incorporated by reference, under essentially the same conditions, i.e., essentially spatially isothermal conditions (no temperature gradient as the driving force for the crystal growth) in which the maximum temperature difference between any two points in the melt is not greater than about 4° C., preferably less than about 2° C. We also prefer to suspend the seed approximately in the center of the melt, and to rotate the seed to ensure melt homogeneity. The ratio by weight of the crystal compound to the flux at the seeding temperature is substantially equal to the saturation value of the crystal compound in the said flux.

While the process of the present invention is particularly useful for crystals of $LiNdP_4O_{12}$ and $BaB_2O_4$, other related compounds can also be grown by this process, for example, with the Ba replaced by Sr, and/or the Nd replaced by any other rare earth element, and/or the Li replaced by K, Rb, or Cs. In addition, any flux which is liquid in the temperature range 500°–1000° C. can be utilized, e.g., $3K_2WO_4 \cdot P_2O_5$, in addition to the preferred fluxes listed below.

DETAILED DESCRIPTION OF THE INVENTION

Several examples describing how to grow the LNP and BB crystals follow below.

Example 1 (LNP)

The flux comprises the oxides of Li and P, in which the ratio by weight of Li to P is in the range of 0.87:1 to 1.11:1. The preferred ratio of Li to P is about 1.05:1.

The flux may comprise a mixture of the oxides $Li_2O$ and $P_2O_5$ in the ratio by weight of $Li_2O$ to $P_2O_5$ of 0.7:1 to 2:1 or of the precursors which form oxides during the heating process, such as carbonates or nitrates of Li or the ammonium salts of P, examples being $Li_2CO_3$, $NH_4H_2PO_4$, and $NH_4H_2AsO_4$ where the As is substituted for the P. Preferably the $LiNdP_4O_{12}$ crystals are prepared from a mixture of $Nd_2O_3$, $Li_2CO_3$ and $NH_4H_2PO_4$ while similarly the $LiNdAs_4O_{12}$ crystals are prepared from mixtures of $Nd_2O_3$, $NH_4H_2AsO_4$ and $Li_2CO_3$. In producing the melt, the mixture of $MNdX_4O_{12}$ and the flux or of their precursors is heated to a temperature of 750° C. to 1100° C. and preferably to a temperature of 1050° C.

The melt is then placed in a crucible formed of a material inert to the flux and the filled crucible is suspended in a growth furnace designed to provide essentially isothermal conditions throughout the melt (the maximum temperature difference between any two points in the melt being about 2° C.).

Before the melt-filled crucible is placed in the growth furnace the furnace is preferably preheated to the temperature of the melt in order to dissolve any crystals that may have formed in the melt during its transfer to the growth furnace. The melt-filled crucible is then placed in the growth furnace and the melt is kept at a temperature of 950° C. to 1000° for about 4 hours in the growth furnace while being stirred.

The temperature of the growth furnace is then ramped to 30°–50° C. below the temperature of the melt over a period of about 1 to 3 hours.

An $LiNdP_4O_{12}$ seed crystal is then suspended in the center of the melt at the end of a rotatable shaft and held in the melt, in the growth furnace, in a stationary position for about 1 to 4 hours. The temperature of the furnace is then set to continually decrease at the rate of not greater than 5° C. per hour and preferably at the rate of 0.1° C.–20° C. per day.

The seed crystal is then rotated in the melt at a rate of 5 to 100 RPM. Preferably the direction of rotation is reversed once every one or two minutes. After 4 to 15 days the crystal is removed from the melt while still maintained in the furnace. The furnace temperature is ramped down to 20° C. at the rate of 20° to 40° C. per hour. The crystal is then removed from the furnace.

A preferred embodiment of the invention will now be described in greater detail in the following example.

A mixture of 664 g of powdered $NH_4H_2PO_4$, 65 g of powdered $Nd_2O_3$, and 179 g of powdered $Li_2CO_3$ should be ball-milled for 1 hour. The powdered mixture should then be loaded into a 110 mm diameter by 80 mm high cylindrical platinum crucible which should be placed in a muffle furnace the internal temperature of which is set at 1000° C. After 16 hours, the crucible should be removed from the muffle furnace and the resultant liquid it contained is poured into a smaller cylindrical platinum crucible, for example, 80 mm in diameter by 70 mm high. This smaller crucible, filled with the liquid, should then be immediately introduced into the growth furnace with elongated heat pipe described in the related application and set on the ceramic crucible base in the furnace (which should be preheated to 950°).

A platinum stirring paddle should be affixed to the end of a rotatable and translatable shaft and introduced into the liquid through the opening at the top of the furnace cavity. This paddle should be rotated in the liquid at 70 RPM for 4 hours during which period the temperature of the liquid should be maintained at 950° C. The paddle should then be removed from the liquid and the furnace temperature then ramped to 870° C. over a period of 1 hour.

A $LiN_4O_{12}$ crystal roughly $4 \times 4 \times 5$ mm$^3$, should be tapped, threaded, and mounted onto the end of a platinum rod affixed to the shaft, and then immersed in the center of the volume of liquid. The temperature of the furnace should then be set to continually decrease at a rate of 5° C. per day. After 2 hours, the LNP crystal should be started to rotate in the liquid at 10 RPM. After 18 more hours, this rotation rate should be increased to 30 RPM After 11 days, the rod should be withdrawn 8 cm so the crystal is out of the melt and the furnace temperature ramped down to 20° C. at a rate of 25° C. per hour. The rod should then be completely removed from the furnace with the LNP crystal on the end of the rod, enlarged by the growth to considerably larger dimensions. Suitable crystals can then be cut from the larger crystal to the sizes required by the optical application.

Example 2 (BBO)

This example is similar to the previous example and only the differences will be described. In the case of BBO, the flux may comprise a mixture of the oxides $XO$, $Y_2O$ and $B_2O_3$, or of the precursors which form the oxides of X, such as carbonates of X, the oxides of Y, such as carbonates or nitrates of Y, and acids of B, where X is Ba for which probably Sr or Ca can be substituted in whole or in part, and Y is Na for which probably Li,K,Rb or Cs can be substituted in whole or in part. Examples of suitable fluxes are $BaCO_3$, $Na_2CO_3$ and $H_3BO_3$; and BaO, $Na_2CO_3$ and $B_2O_3$.

The preferred ratios of X:Y:B is 0:1:1 or 1:2:2.

The preferred crystal to be grown is $BaB_2O_4$, though it is expected that Sr or Ca can replace the Ba in whole or in part.

In producing the melt, the mixture of $BaB_2O_4$ and the flux or of their precursors should be heated to a temperature of 750° C.–1100° C., preferably 1050° C. Following the crystal growth, the temperature of the growth furnace should be ramped down to 75°–85° C. below the melt temperature over a period of 1–3 hours.

A suitable starting composition is a mixture of 592 g of powdered $BaCO_3$, 209 g of powdered $B_2O_3$, and 100 g of powdered $Na_2CO_3$, processed as described in Example 1.

During the pre-heating cycle, before the seed is immersed in the melt and after the paddle has been removed, the furnace temperature should be ramped to 913° C. over a period of one hour. Preferably in both Examples 1 and 2 the central axis of the seed crystal is oriented 90° to the vertical.

What is claimed is:

1. In a method of producing large substantially flaw-free single crystals of a composition of the formula $LiNdP_4O_{12}$, the steps comprising:
    (a) preparing a mixture of $LiNdP_4O_{12}$ and a flux comprising the oxides $Li_2O$ and $P_2O_5$ in the ratio by weight of $Li_2O$ to $P_2O_5$ in the range of 0.7:1 to 2:1 or of their precursors and producing a melt thereof by heating said mixture, to a temperature of 750° C.–1000° C. the ratio by weight of $LiNdP_4O_{12}$ to flux at the seeding temperature being about equal to the saturation value of said $LiNdP_4O_{12}$ in said flux;
    (b) suspending a seed crystal of said $LiNdP_4O_{12}$ in said melt;
    (c) slowly decreasing the temperature of said melt while maintaining essentially spatially isothermal conditions throughout said melt, the maximum temperature difference being not greater than about 4° C., to thereby cause said $LiNdP_4O_{12}$ to crystallize from said melt on said seed crystal; and
    (d) continuing decreasing the temperature of said melt until crystallization of said $LiNdP_4O_{12}$ on said seed crystal is completed.

2. In a method of producing large substantially flaw-free single crystals of a composition of the formula $XB_2O_4$ wherein X is an element selected from the group consisting of Ba, Sr and Ca, the steps comprising:
    (a) preparing a mixture of $XB_2O_4$ and a flux comprising the oxides XO, $Y_2O$ wherein Y is an element selected from the group consisting of Na, Li, K, Rb and Cs and $B_2O_3$ in the ratio by weight of X:Y:B of 0:1:1 or 1:2:2 or of their precursors and producing a melt thereof by heating said mixture to a temperature of 750° C.–1100° C., the ratio by weight of $XB_2O_4$ to flux at the seeding temperature being about equal to the saturation value of said $XB_2O_4$ in said flux;
    (b) suspending a seed crystal of said $XB_2O_4$ in said melt;
    (c) slowly decreasing the temperature of said melt while maintaining essentially spatially isothermal conditions throughout said melt, the maximum temperature difference being not greater than about 4° C., to thereby cause said $XB_2O_4$ to crystallize from said melt on said seed crystal; and
    (d) continuing decreasing the temperature of said melt until crystalization of said $XB_2O_4$ on said seed crystal is completed.

3. A method as set forth in claims 1 or 2, wherein the seed is immersed in the middle of the melt.

4. A method as set forth in claims 1 or 2, wherein the maximum temperature difference is not greater than about 2° C.

5. A method as set forth in claims 1 or 2, wherein the seed crystal is rotated.

6. A method as set forth in claims 1 or 2, wherein the seed crystal is rotated with periodic reversals.

7. A method as set forth in claims 1 or 2, wherein the seed crystal is oriented at about 90° with respect to the vertical.

8. A method as set forth in claims 1 or 2, wherein step (c) is carried out at a rate of 0.5° C.–10° C./day.

9. A method as set further in claims 1 or 2, wherein the method is carried out in a furnance surrounded by an elongated heat pipe.

* * * * *